United States Patent
Tabrizi et al.

(10) Patent No.: US 10,861,556 B2
(45) Date of Patent: Dec. 8, 2020

(54) METHOD AND SYSTEM FOR ADAPTING SOLID STATE MEMORY WRITE PARAMETERS TO SATISFY PERFORMANCE GOALS BASED ON DEGREE OF READ ERRORS

(71) Applicant: EMC IP Holding Company LLC, Hopkinton, MA (US)

(72) Inventors: Haleh Tabrizi, San Francisco, CA (US); Seungjune Jeon, Santa Clara, CA (US); Andrew Cullen, Midleton (IE)

(73) Assignee: EMC IP Holding Company LLC, Hopkinton, MA (US)

(*) Notice: Subject to any disclaimer, the term of this patent is extended or adjusted under 35 U.S.C. 154(b) by 0 days.

(21) Appl. No.: 16/520,263

(22) Filed: Jul. 23, 2019

(65) Prior Publication Data

US 2019/0348125 A1 Nov. 14, 2019

Related U.S. Application Data

(63) Continuation of application No. 15/581,285, filed on Apr. 28, 2017, now Pat. No. 10,403,366.

(51) Int. Cl.
*G11C 16/10* (2006.01)
*G11C 16/26* (2006.01)
(Continued)

(52) U.S. Cl.
CPC ........... *G11C 16/10* (2013.01); *G11C 11/56* (2013.01); *G11C 16/26* (2013.01); *G11C 16/3459* (2013.01); *G11C 29/52* (2013.01)

(58) Field of Classification Search
CPC ........ G11C 16/10; G11C 29/52; G11C 11/56; G11C 16/3459; G11C 16/26;
(Continued)

(56) References Cited

U.S. PATENT DOCUMENTS 6,016,275 A   1/2000  Han
6,862,675 B1  3/2005  Wakimoto
(Continued)

FOREIGN PATENT DOCUMENTS

CN   102150140 A   8/2011
CN   103902234 A   7/2014
(Continued)

OTHER PUBLICATIONS

Ankit Singh Rawat et al.; "Locality and Availability in Distributed Storage," arXiv:1402.2011v1 [cs.IT]; Feb. 10, 2014.
(Continued)

*Primary Examiner* — Mushfique Siddique
(74) *Attorney, Agent, or Firm* — Chamberlain, Hrdlicka, White, Williams & Aughtry

(57) ABSTRACT

In general, embodiments of the technology relate to a method for adjusting solid state memory write parameters. The method includes obtaining a performance goal for the solid state memory, receiving a client write request for data from a client, where the client write request comprises a logical address and data to be written. The method further includes determining a physical address corresponding to the logical address, where the physical address comprises a page number for a physical page in the persistent storage, obtaining at least one verify threshold value using the performance goal, issuing a control module program request including the data to be written and the at least one verify threshold value to a storage module, where the storage module comprises the physical page, and programming the data into the physical page of the storage module using the at least one verify threshold value.

12 Claims, 9 Drawing Sheets

(51) Int. Cl.
*G11C 16/34* (2006.01)
*G11C 11/56* (2006.01)
*G11C 29/52* (2006.01)

(58) Field of Classification Search
CPC .......... G11C 16/349; G11C 2211/5621; G11C 29/42; G11C 29/028; G11C 16/08; G11C 11/5642; G11C 11/5628; G06F 12/0246
See application file for complete search history.

(56) References Cited

U.S. PATENT DOCUMENTS

| | | | |
|---|---|---|---|
| 7,559,004 | B1 | 7/2009 | Chang et al. |
| 8,189,379 | B2 | 5/2012 | Camp et al. |
| 8,259,506 | B1 | 9/2012 | Sommer et al. |
| 8,305,812 | B2 * | 11/2012 | Levy .................. G06F 11/1048 365/185.19 |
| 8,335,893 | B2 | 12/2012 | Tagawa |
| 8,694,724 | B1 | 4/2014 | Linnell et al. |
| 8,819,503 | B2 | 8/2014 | Melik-Martirosian et al. |
| 8,868,842 | B2 | 10/2014 | Yano et al. |
| 8,891,303 | B1 * | 11/2014 | Higgins ................ G11C 16/10 365/185.1 |
| 8,934,284 | B2 | 1/2015 | Patapoutian et al. |
| 8,995,197 | B1 * | 3/2015 | Steiner ................ G06F 12/0246 365/185.19 |
| 9,026,764 | B2 | 5/2015 | Hashimoto |
| 9,195,586 | B2 | 11/2015 | Cometti et al. |
| 9,330,767 | B1 * | 5/2016 | Steiner ................ G06F 11/1048 |
| 9,368,225 | B1 | 6/2016 | Pinkovich et al. |
| 9,496,043 | B1 * | 11/2016 | Camp .................. G11C 16/26 |
| 9,564,233 | B1 * | 2/2017 | Cho .................... G11C 16/3459 |
| 9,606,737 | B2 | 3/2017 | Kankani et al. |
| 9,645,177 | B2 | 5/2017 | Cohen et al. |
| 9,690,655 | B2 * | 6/2017 | Tabrizi ................ G06F 11/1072 |
| 9,710,180 | B1 * | 7/2017 | Van Gaasbeck .... G06F 12/0238 |
| 9,740,425 | B2 | 8/2017 | Bakshi et al. |
| 9,798,334 | B1 * | 10/2017 | Tabrizi ................ G06F 3/06 |
| 9,842,060 | B1 | 12/2017 | Jannyavula Venkata et al. |
| 9,864,525 | B2 | 1/2018 | Kankani et al. |
| 9,891,844 | B2 | 2/2018 | Kankani et al. |
| 9,905,289 | B1 | 2/2018 | Jeon et al. |
| 2005/0172082 | A1 | 8/2005 | Liu et al. |
| 2005/0223185 | A1 | 10/2005 | Lee |
| 2005/0278486 | A1 | 12/2005 | Trika et al. |
| 2007/0260811 | A1 | 11/2007 | Merry, Jr. et al. |
| 2007/0263444 | A1 | 11/2007 | Gorobets et al. |
| 2007/0266200 | A1 | 11/2007 | Gorobets et al. |
| 2008/0082725 | A1 | 4/2008 | Elhamias |
| 2008/0082726 | A1 | 4/2008 | Elhamias |
| 2009/0144598 | A1 | 6/2009 | Yoon et al. |
| 2010/0306577 | A1 | 12/2010 | Dreifus et al. |
| 2010/0306580 | A1 | 12/2010 | McKean et al. |
| 2010/0332923 | A1 | 12/2010 | D'Abreu et al. |
| 2011/0051521 | A1 * | 3/2011 | Levy .................. G11C 11/5628 365/185.19 |
| 2011/0173484 | A1 | 7/2011 | Schuette et al. |
| 2011/0202818 | A1 | 8/2011 | Yoon et al. |
| 2012/0110239 | A1 * | 5/2012 | Goss .................. G06F 12/0246 711/103 |
| 2012/0192035 | A1 | 7/2012 | Nakanishi |
| 2012/0203951 | A1 | 8/2012 | Wood et al. |
| 2012/0224425 | A1 * | 9/2012 | Fai .................... G11C 11/5642 365/185.09 |
| 2012/0236656 | A1 | 9/2012 | Cometti |
| 2012/0239991 | A1 | 9/2012 | Melik-Martirosian |
| 2012/0268994 | A1 | 10/2012 | Nagashima |
| 2012/0290899 | A1 | 11/2012 | Cideciyan et al. |
| 2013/0019057 | A1 * | 1/2013 | Stephens ............... G06F 11/108 711/103 |
| 2013/0047044 | A1 | 2/2013 | Weathers et al. |
| 2013/0094286 | A1 | 4/2013 | Sridharan et al. |
| 2013/0151214 | A1 | 6/2013 | Ryou |
| 2013/0176784 | A1 | 7/2013 | Cometti et al. |
| 2013/0185487 | A1 | 7/2013 | Kim et al. |
| 2013/0227200 | A1 | 8/2013 | Cometti et al. |
| 2013/0311712 | A1 * | 11/2013 | Aso .................... G06F 12/0246 711/103 |
| 2014/0006688 | A1 | 1/2014 | Yu et al. |
| 2014/0101499 | A1 | 4/2014 | Griffin |
| 2014/0181378 | A1 | 6/2014 | Saeki et al. |
| 2014/0181595 | A1 | 6/2014 | Hoang et al. |
| 2014/0195725 | A1 * | 7/2014 | Bennett ............... G06F 12/0246 711/103 |
| 2014/0208174 | A1 | 7/2014 | Ellis et al. |
| 2014/0215129 | A1 * | 7/2014 | Kuzmin ............... G06F 12/0246 711/103 |
| 2014/0229799 | A1 | 8/2014 | Hubris et al. |
| 2014/0293699 | A1 * | 10/2014 | Yang .................. G11C 11/5628 365/185.17 |
| 2014/0347936 | A1 | 11/2014 | Ghaly |
| 2014/0359202 | A1 | 12/2014 | Sun et al. |
| 2014/0365836 | A1 * | 12/2014 | Jeon ..................... G11C 16/26 714/721 |
| 2015/0078094 | A1 | 3/2015 | Nagashima |
| 2015/0082121 | A1 | 3/2015 | Wu et al. |
| 2015/0205664 | A1 * | 7/2015 | Janik .................. G06F 11/1012 714/764 |
| 2015/0227418 | A1 | 8/2015 | Cai et al. |
| 2015/0357045 | A1 | 12/2015 | Moschiano et al. |
| 2016/0004464 | A1 | 1/2016 | Shen |
| 2016/0092304 | A1 * | 3/2016 | Tabrizi ................ G06F 11/1072 714/6.24 |
| 2016/0093397 | A1 * | 3/2016 | Tabrizi ............... G11C 16/3495 711/103 |
| 2016/0148708 | A1 | 5/2016 | Tuers et al. |
| 2016/0170682 | A1 | 6/2016 | Bakshi et al. |
| 2016/0306591 | A1 | 10/2016 | Ellis et al. |
| 2016/0342344 | A1 | 11/2016 | Kankani et al. |
| 2016/0342345 | A1 | 11/2016 | Kankani et al. |
| 2017/0090783 | A1 | 3/2017 | Fukutomi et al. |
| 2017/0109040 | A1 | 4/2017 | Raghu et al. |
| 2017/0117032 | A1 * | 4/2017 | Takizawa ............ G11C 11/4091 |
| 2017/0168713 | A1 | 6/2017 | Kankani et al. |
| 2017/0228180 | A1 | 8/2017 | Shen |
| 2017/0235486 | A1 | 8/2017 | Martineau et al. |
| 2017/0262336 | A1 * | 9/2017 | Tabrizi ................ G06F 11/1072 |
| 2017/0315753 | A1 | 11/2017 | Blount |
| 2018/0018269 | A1 | 1/2018 | Jannyavula Venkata et al. |
| 2018/0032439 | A1 | 2/2018 | Jenne et al. |
| 2018/0034476 | A1 | 2/2018 | Kayser et al. |
| 2018/0039795 | A1 | 2/2018 | Gulati |
| 2018/0060230 | A1 | 3/2018 | Kankani et al. |

FOREIGN PATENT DOCUMENTS

| | | |
|---|---|---|
| JP | 2011-100519 A | 5/2011 |
| JP | 2012-203957 A | 10/2012 |
| JP | 2013-25821 A | 2/2013 |
| JP | 2013-176784 A | 9/2013 |

OTHER PUBLICATIONS

Beomkyu Shin et al.; "Error Control Coding and Signal Processing for Flash Memories"; IEEE International Symposium on Circuits and Systems (ISCAS); pp. 409-412; 2012.

Borja Peleato et al.; "Maximizing MLC NAND lifetime and reliability in the presence of write noise"; IEEE International Conference on Communications (ICC); pp. 3752-3756; 2012.

Borja Peleato et al.; "Towards Minimizing Read Time for NAND Flash"; Globecom 2012—Symposium on Selected Areas in Communication; pp. 3219-3224; 2012.

Chanik Park et al.; "A Reconfigurable FTL (Flash Translation Layer) Architecture for NAND Flash-Based Applications"; ACM Transactions on Embedded Computing Systems; vol. 7, No. 4, Article 38; Jul. 2008.

Cheng Huang et al.; "Pyramid Codes: Flexible Schemes to Trade Space for Access Efficiency in Reliable Data Storage Systems"; Sixth IEEE International Symposium on Network Computing and Applications (NCA); 2007.

(56) References Cited

OTHER PUBLICATIONS

Dimitris Papailiopoulos et al.; "Simple Regenerating Codes: Network Coding for Cloud Storage"; arXiv:1109.0264v1 [cs.IT]; Sep. 1, 2011.
Eitan Yaakobi et al.; Error Characterization and Coding Schemes for Flash Memories; IEEE Globecom 2010 Workshop on Application of Communication Theory to Emerging Memory Technologies; pp. 1856-1860; 2010.
Eran Gal et al.; "Algorithms and Data Structures for Flash Memories"; ACM Computing Surveys (CSUR); vol. 37, No. 2; pp. 138-163; Jun. 2005.
Feng Chen et al.; "Essential Roles of Exploiting Internal Parallelism of Flash Memory based Solid State Drives in High-Speed Data Processing"; 2011 IEEE 17th International Symposium on High Performance Computer Architecture (HPCA); pp. 266-277; 2011.
Frédérique Oggier et al.; "Self-repairing Homomorphic Codes for Distributed Storage Systems"; IEEE INFOCOM 2011; pp. 1215-1223; 2011.
Haleh Tabrizi et al.; "A Learning-based Network Selection Method in Heterogeneous Wireless Systems"; IEEE Global Telecommunications Conference (GLOBECOM 2011); 2011.
Hongchao Zhou et al.; "Error-Correcting Schemes with Dynamic Thresholds in Nonvolatile Memories"; 2011 IEEE International Symposium on Information Theory Proceedings; pp. 2143-2147; 2011.
Hyojin Choi et al.; "VLSI Implementation of BCH Error Correction for Multilevel Cell NAND Flash Memory"; IEEE Transactions on Very Large Scale Integration (VLSI) Systems; vol. 18, No. 5; pp. 843-847; May 2010.
Junsheng Han et al.; "Reliable Memories with Subline Accesses"; International Symposium on Information Theory (ISIT); pp. 2531-2535, Jun. 2007.
Mendel Rosenblum et al.; "The Design and Implementation of a Log-Structured File System"; ACM Transactions on Computer Systems; vol. 10; No. 1; pp. 26-52; Feb. 1992.
Neal Mielke et al.; "Recovery Effects in the Distributed Cycling of Flash Memories"; IEEE 44th Annual International Reliability Physics Symposium; pp. 29-35; 2006.
Osama Khan et al.; "In Search of I/O-Optimal Recovery from Disk Failures"; HotStorage 2011; Jun. 2011.
Parikshit Gopalan et al.; "On the Locality of Codeword Symbols"; arXiv:1106.3625v1[cs.IT]; Jun. 18, 2011.
Ramesh Pyndiah et al.; "Near Optimum Decoding of Product Codes"; Global Telecommunications Conference (GLOBECOM '94), Communications: The Global Bridge pp. 339-343; 1994.
Te-Hsuan Chen et al.; "An Adaptive-Rate Error Correction Scheme for NAND Flash Memory"; 27th IEEE VLSI Test Symposium; pp. 53-58; 2009.
Yongjune Kim et al.; "Modulation Coding for Flash Memories"; 2013 International Conference on Computing, Networking and Communications, Data Storage Technology and Applications Symposium; pp. 961-967; 2013.
Yu Cai et al.; "Flash Correct-and-Refresh: Retention-Aware Error Management for Increased Flash Memory Lifetime"; Proceedings of the IEEE International Conference on Computer Design (ICCD); pp. 94-101; 2012.
Yu Cai et al.; "Program Interference in MLC NAND Flash Memory: Characterization, Modeling, and Mitigation"; 2013 IEEE International Conference on Computer Design (ICCD); pp. 123-130; 2013.
Yu Cai et al.; "Threshold Voltage Distribution in MLC NAND Flash Memory: Characterization, Analysis, and Modeling"; Proceedings of the Conference on Design, Automation and Test in Europe; pp. 1285-1290; 2013.
Notice of Grounds of Rejection issued in corresponding Japanese Application No. 2017-212749, dated Dec. 3, 2019.

\* cited by examiner

METHOD AND SYSTEM FOR ADAPTING SOLID STATE MEMORY WRITE PARAMETERS TO SATISFY PERFORMANCE GOALS BASED ON DEGREE OF READ ERRORS

CROSS-REFERENCE TO RELATED APPLICATIONS

This application is a continuation application of U.S. patent application Ser. No. 15/581,285, filed on Apr. 28, 2017, and entitled: "METHOD AND SYSTEM FOR ADAPTING SOLID STATE MEMORY WRITE PARAMETERS TO SATISFY PERFORMANCE GOALS BASED ON DEGREE OF READ ERRORS". Accordingly, this application claims benefit of U.S. patent application Ser. No. 15/581,285 under 35 U.S.C. § 120. U.S. patent application Ser. No. 15/581,285 is here by incorporated by reference in its entirety.

BACKGROUND

One important performance metric for a solid state memory storage system is the longevity of the solid state memory. Solid state memory ages as write operations are performed. The degree of aging may depend on the write parameterization.

SUMMARY

In one aspect, embodiments disclosed herein relate to a method of adjusting solid state memory write parameters that includes setting a verify threshold value to a level that results in a number of correctable read errors when data, written using the verify threshold value, are read from a storage module. The method includes receiving, from a client, a client write request with a logical address and data to be written, and identifying a physical address corresponding to the logical address. The physical address includes a page number for a physical page in the storage module. The method also includes obtaining the verify threshold value; issuing a control module program request that includes the data to be written and the verify threshold value to the storage module; and programming the data into the physical page using the verify threshold value. In embodiments disclosed herein, setting the verify threshold value includes monitoring a correctable read error frequency; adjusting the verify threshold value using a verified voltage based on the correctable read error frequency.

In another aspect, embodiments disclosed herein relate to a method of adjusting solid state memory write parameters that includes setting a verify threshold value to a level suitable for avoiding read errors when data, written using the verify threshold value, are read from a storage module. The method includes receiving, from a client, a client write request with a logical address and data to be written, and identifying a physical address corresponding to the logical address. The physical address includes a page number for a physical page in the storage module. The method also includes obtaining the verify threshold value; issuing a control module program request that includes the data to be written and the verify threshold value to the storage module; and programming the data into the physical page using the verify threshold value. In embodiments disclosed herein, setting the verify threshold value includes monitoring a correctable read error frequency; adjusting the verify threshold value using a verified voltage based on the correctable read error frequency.

DETAILED DESCRIPTION

Specific embodiments of the technology will now be described in detail with reference to the accompanying figures. In the following detailed description of embodiments of the technology, numerous specific details are set forth in order to provide a more thorough understanding of the technology. However, it will be apparent to one of ordinary skill in the art that the technology may be practiced without these specific details. In other instances, well-known features have not been described in detail to avoid unnecessarily complicating the description In the following description of FIGS. 1-7, any component described with regard to a figure, in various embodiments of the technology, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the technology, any description of the components of a figure is to be interpreted as an optional embodiment which may be implemented in addition to, in conjunction with, or in place of the embodiments described with regard to a corresponding like-named component in any other figure.

In general, embodiments of the technology relate to programming memory cells of solid-state storage. More specifically, embodiments of the technology relate to varying the voltages, programmed into memory cells, depending on the condition of the memory cells and/or other factors. The ability to vary the programmed voltages may be used to prolong the lifetime of the solid-state storage, reduce read error rates and/or data loss, and/or to increase performance, as described below.

The following description describes one or more systems and methods for implementing one or more embodiments of the technology.

Figure 1A:
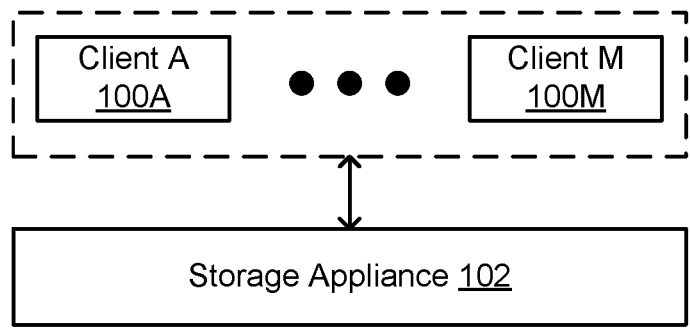
FIGS. 1A-1C show systems in accordance with one or more embodiments of the technology.
Figure 1B:
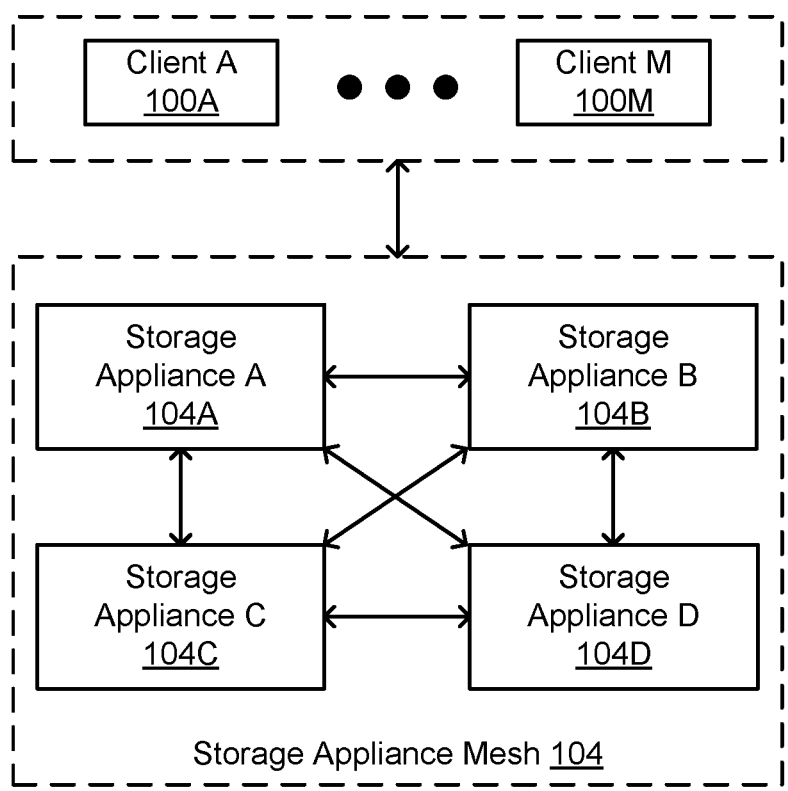
Figure 1C:
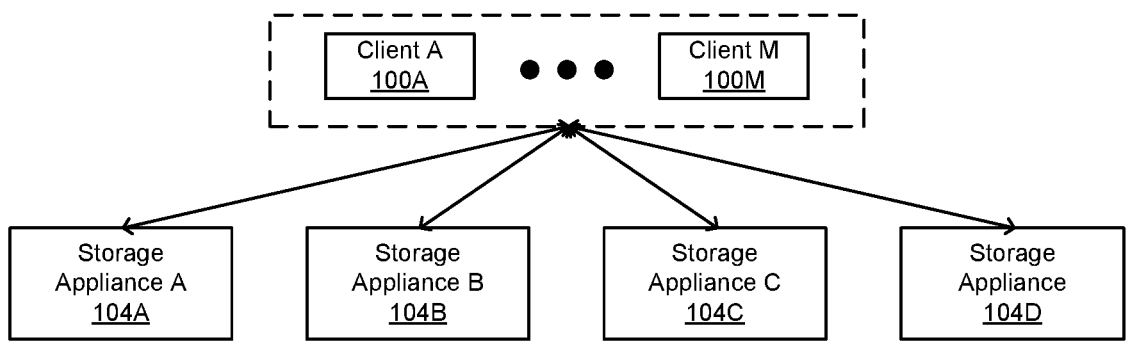

FIGS. 1A-1C show systems in accordance with one or more embodiments of the technology. Referring to FIG. 1A, the system includes one or more clients (client A (100A), client M (100M)) operatively connected to a storage appliance (102).

In one embodiment of the technology, clients (100A, 100M) correspond to any physical system that includes functionality to issue a read request to the storage appliance (102) and/or issue a write request to the storage appliance (102). Though not shown in FIG. 1A, each of the clients (100A, 100M) may include a client processor (not shown), client memory (not shown), and any other software and/or hardware necessary to implement one or more embodiments of the technology.

In one embodiment of the technology, the client (100A-100M) is configured to execute an operating system (OS) that includes a file system. The file system provides a mechanism for the storage and retrieval of files from the storage appliance (102). More specifically, the file system includes functionality to perform the necessary actions to issue read requests and write requests to the storage appliance. The file system also provides programming interfaces to enable the creation and deletion of files, reading and writing of files, performing seeks within a file, creating and deleting directories, managing directory contents, etc. In addition, the file system also provides management interfaces to create and delete file systems. In one embodiment of the technology, to access a file, the operating system (via the file system) typically provides file manipulation interfaces to open, close, read, and write the data within each file and/or to manipulate the corresponding metadata.

Continuing with the discussion of FIG. 1A, in one embodiment of the technology, the clients (100A, 100M) are configured to communicate with the storage appliance (102) using one or more of the following protocols: Peripheral Component Interconnect (PCI), PCI-Express (PCIe), PCI-eXtended (PCI-X), Non-Volatile Memory Express (NVMe), Non-Volatile Memory Express (NVMe) over a PCI-Express fabric, Non-Volatile Memory Express (NVMe) over an Ethernet fabric, and Non-Volatile Memory Express (NVMe) over an Infiniband fabric. Those skilled in the art will appreciate that the technology is not limited to the aforementioned protocols.

In one embodiment of the technology, the storage appliance (102) is a system that includes volatile and persistent storage and is configured to service read requests and/or write requests from one or more clients (100A, 100M). Various embodiments of the storage appliance (102) are described below in FIG. 2.

Referring to FIG. 1B, FIG. 1B shows a system in which clients (100A, 100M) are connected to multiple storage appliances (104A, 104B, 104C, 104D) arranged in a mesh configuration (denoted as storage appliance mesh (104) in FIG. 1B). As shown in FIG. 1B, the storage appliance mesh (104) is shown in a fully-connected mesh configuration—that is, every storage appliance (104A, 104B, 104C, 104D) in the storage appliance mesh (104) is directly connected to every other storage appliance (104A, 104B, 104C, 104D) in the storage appliance mesh (104). In one embodiment of the technology, each of the clients (100A, 100M) may be directly connected to one or more storage appliances (104A, 104B, 104C, 104D) in the storage appliance mesh (104). Those skilled in the art will appreciate that the storage appliance mesh may be implemented using other mesh configurations (e.g., partially connected mesh) without departing from the technology.

Referring to FIG. 1C, FIG. 1C shows a system in which clients (100A, 100M) are connected to multiple storage appliances (104A, 104B, 104C, 104D) arranged in a fan-out configuration. In this configuration, each client (100A, 100M) is connected to one or more of the storage appliances (104A, 104B, 104C, 104D); however, there is no communication between the individual storage appliances (104A, 104B, 104C, 104D).

Those skilled in the art will appreciate that while FIGS. 1A-1C show storage appliances connected to a limited number of clients, the storage appliances may be connected to any number of clients without departing from the technology. Those skilled in the art will appreciate that while FIGS. 1A-1C show various system configurations, the technology is not limited to the aforementioned system configurations. Further, those skilled in the art will appreciate that the clients (regardless of the configuration of the system) may be connected to the storage appliance(s) using any other physical connection without departing from the technology.

Figure 2:
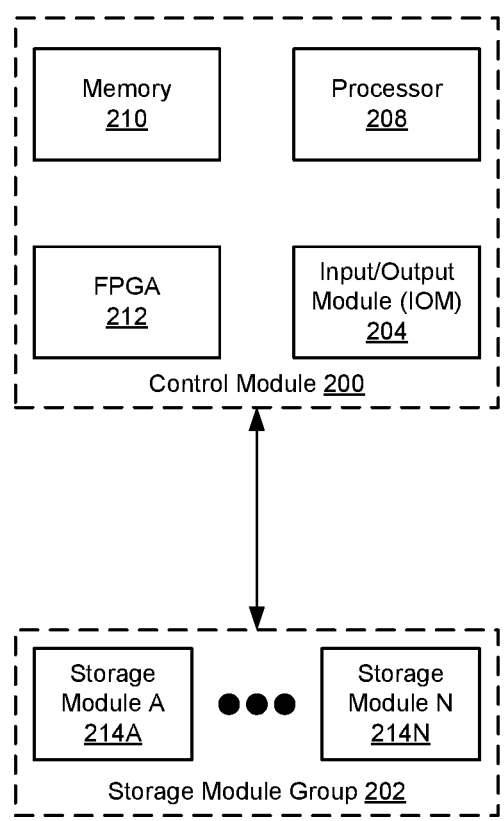
FIG. 2 shows storage appliances in accordance with one or more embodiments of the technology.

FIG. 2 shows embodiments of a storage appliance in accordance with one or more embodiments of the technology. The storage appliance includes a control module (200) and a storage module group (202). Each of these components is described below. In general, the control module (200) is configured to manage the servicing of read and write requests from one or more clients. In particular, the control module is configured to receive requests from one or more clients via the Input/Output Module (TOM), (discussed below), to process the request (which may include sending the request to the storage module), and to provide a response to the client after the request has been serviced. Additional details about the components in the control module are included below. Further, the operation of the control module with respect to servicing write requests is described below with reference to FIGS. 6A-6B.

Continuing with the discussion of FIG. 2, in one embodiment of the technology, the control module (200) includes an Input/Output Module (TOM) (204), a processor (208), a memory (210), and, optionally, a Field Programmable Gate Array (FPGA) (212). In one embodiment of the technology, the IOM (204) is the physical interface between the clients (e.g., 100A, 100M in FIGS. 1A-1C) and the other components in the storage appliance. The IOM supports one or more of the following protocols: PCI, PCIe, PCI-X, Ethernet (including, but not limited to, the various standards defined under the IEEE 802.3a-802.3bj), Infiniband, and Remote Direct Memory Access (RDMA) over Converged Ethernet (RoCE). Those skilled in the art will appreciate that the IOM may be implemented using protocols other than those listed above without departing from the technology.

Continuing with FIG. 2, the processor (208) is a group of electronic circuits with a single core or multi-cores that are configured to execute instructions. In one embodiment of the technology, the processor (208) may be implemented using a Complex Instruction Set (CISC) Architecture or a Reduced Instruction Set (RISC) Architecture. In one or more embodiments of the technology, the processor (208) includes a root complex (as defined by the PCIe protocol). In one embodiment of the technology, if the control module (200) includes a root complex (which may be integrated into the processor (208)) then the memory (210) is connected to the processor (208) via the root complex. Alternatively, the memory (210) is directly connected to the processor (208) using another point-to-point connection mechanism. In one embodiment of the technology, the memory (210) corresponds to any volatile memory including, but not limited to, Dynamic Random-Access Memory (DRAM), Synchronous DRAM, SDR SDRAM, and DDR SDRAM.

In one embodiment of the technology, the processor (208) is configured to create and update an in-memory data structure (not shown), where the in-memory data structure is stored in the memory (210). In one embodiment of the technology, the in-memory data structure includes information described in FIG. 4.

In one embodiment of the technology, the processor is configured to offload various types of processing to the FPGA (212). In one embodiment of the technology, the FPGA (212) includes functionality to calculate checksums for data that is being written to the storage module(s) and/or data that is being read from the storage module(s). Further, the FPGA (212) may include functionality to calculate P and/or Q parity information for purposes of storing data in the storage module(s) using a RAID scheme (e.g., RAID 2-RAID 6) and/or functionality to perform various calculations necessary to recover corrupted data stored using a RAID scheme (e.g., RAID 2-RAID 6). In one embodiment of the technology, the storage module group (202) includes one or more storage modules (214A, 214N) each configured to store data. One embodiment of a storage module is described below in FIG. 3.

Figure 3:
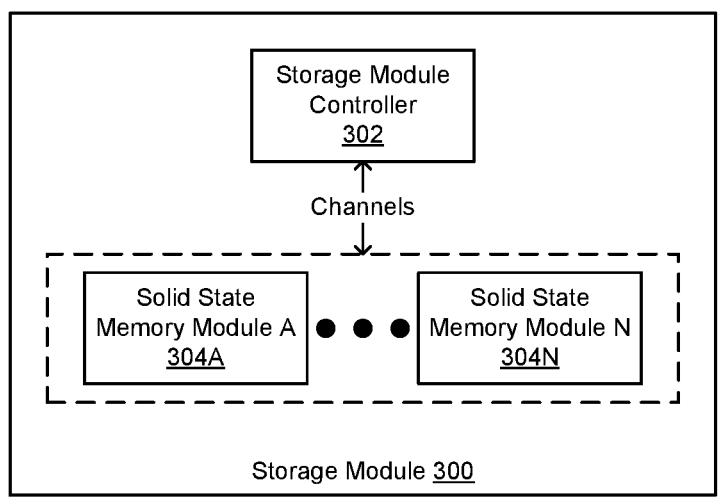
FIG. 3 shows a storage module in accordance with one or more embodiments of the technology.

FIG. 3 shows a storage module in accordance with one or more embodiments of the technology. The storage module (300) includes a storage module controller (302), memory (not shown), and one or more solid-state memory modules (304A, 304N). Each of these components is described below.

In one embodiment of the technology, the storage module controller (300) is configured to receive requests to read from and/or write data to one or more control modules. Further, the storage module controller (300) is configured to service the read and write requests using the memory (not shown) and/or the solid-state memory modules (304A, 304N).

In one embodiment of the technology, the memory (not shown) corresponds to any volatile memory including, but not limited to, Dynamic Random-Access Memory (DRAM), Synchronous DRAM, SDR SDRAM, and DDR SDRAM.

In one embodiment of the technology, the solid-state memory modules correspond to any data storage device that uses solid-state memory to store persistent data. In one embodiment of the technology, solid-state memory may include, but is not limited to, NAND Flash memory and NOR Flash memory. Further, the NAND Flash memory and the NOR flash memory may include single-level cells (SLCs), multi-level cell (MLCs), or triple-level cells (TLCs). Those skilled in the art will appreciate that embodiments of the technology are not limited those types of memory.

Figure 4:
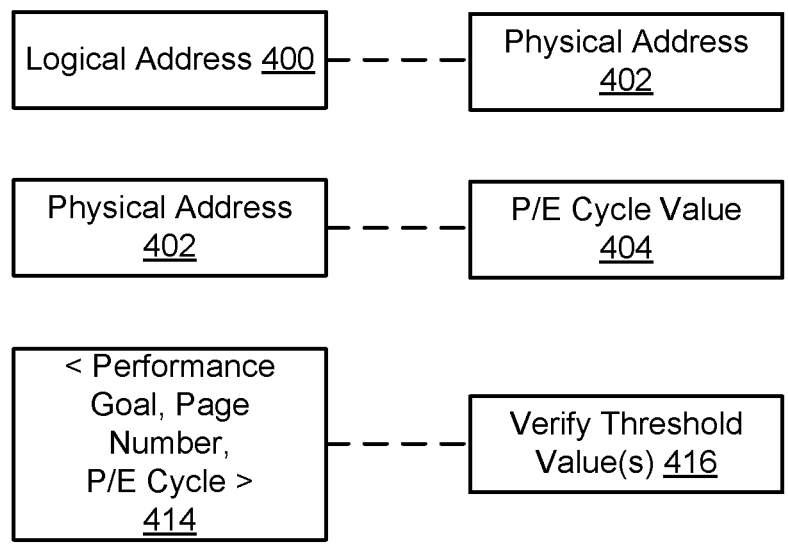
FIG. 4 shows the relationship between various components in accordance with one or more embodiments of the technology.

FIG. 4 shows the relationship between various components in accordance with one or more embodiments of the technology. More specifically, FIG. 4 shows the various types of information that is stored in the memory of the control module. The control module includes functionality to update the information stored in the memory of the control module. The information described below may be stored in one or more in-memory data structures. Further, any data structure type (e.g., arrays, linked lists, hash tables, etc.) may be used to organize the following information within the in-memory data structure(s) provided that the data structure type(s) maintains the relationships (as described below) between the information.

The memory includes a mapping of logical addresses (400) to physical addresses (402). In one embodiment of the technology, the logical address (400) is an address to which the data are to be written from the perspective of the client (e.g., 100A, 100M in FIG. 1A). Said another way, the logical address (400) corresponds to the address that is used by the file system on the client when issuing a write request to the storage appliance.

In one embodiment of the technology, the logical address is (or includes) a hash value generated by applying a hash function (e.g., SHA-1, MD-5, etc.) to an n-tuple, where the n-tuple is <object ID, offset ID>. In one embodiment of the technology, the object ID defines a file and the offset ID defines a location relative to the starting address of the file. In another embodiment of the technology, the n-tuple is <object ID, offset ID, birth time>, where the birth time corresponds to the time when the file (identified using the object ID) was created. Alternatively, the logical address may include a logical object ID and a logical byte address, or a logical object ID and a logical address offset. In another embodiment of the technology, the logical address includes an object ID and an offset ID. Those skilled in the art will appreciate that multiple logical addresses may be mapped to a single physical address and that the logical address content and/or format is not limited to the above embodiments.

In one embodiment of the technology, the physical address (402) corresponds to a physical location in a solid-state memory module (304A, 304N) in FIG. 3. In one embodiment of the technology, the physical address is defined as the following n-tuple: <storage module, channel, chip enable, LUN, plane, block, page number, byte>.

In one embodiment of the technology, each physical address (402) is associated with a program/erase (P/E) cycle value (404). The P/E cycle value may represent: (i) the number of P/E cycles that have been performed on the physical location defined by the physical address or (ii) a P/E cycle range (e.g., 5,000-9,999 P/E cycles), where the number of P/E cycles that have been performed on the physical location defined by the physical address is within the P/E cycle range. In one embodiment of the technology, a P/E cycle is the writing of data to one or more pages in an erase block (i.e., the smallest addressable unit for erase operations, typically, a set of multiple pages) and the erasure of that block, in either order.

The P/E cycle values may be stored on a per page basis, a per block basis, on a per set of blocks basis, and/or at any other level of granularity. The control module includes functionality to update, as appropriate, the P/E cycle values (402) when data is written to (and/or erased from) the solid-state storage modules.

In one embodiment of the technology, the in-memory data structure includes a mapping of <performance goal, page number, P/E cycle value> (414) to one or more verify threshold values (416). The "performance goal" parameter may be used to specify a goal for which the verify threshold values (416) are to be optimized. For example, a goal of maximizing the lifetime of a storage module may require thresholds different from a goal of enhancing read performance. Multiple performance goals may be defined for a storage appliance, and based on the selection of a particular performance goal, the appropriate verify thresholds may be selected. Performance goals may further change during the use of the storage appliance. For example, while the storage appliance is used in a performance-critical environment that requires a high read performance, the performance goals may be set to maximize read performance. Later, in a more conservative environment, the performance goal may be updated to prolong the lifetime of the storage modules in the storage appliance. A system administrator may thus specify a different performance goal at any time, or alternatively the performance goal may even be automatically adjusted based on the detection of certain performance requirements, such as a particular read throughput.

The determination of verify threshold values (416) depending on a particular goal are further described below. The aforementioned mapping may further include any other parameter(s) (i.e., one or more parameters in addition to page number and P/E cycle value) that affects the solid state memory (e.g., temperature, workload, etc.). In one embodiment of the technology, the P/E cycle value in <performance goal, page number, P/E cycle value> (414) may be expressed as a P/E cycle or a P/E cycle range.

In one embodiment of the technology, verify threshold value(s) (416) correspond to voltages or a shift value, where the shift value corresponds to a voltage shift of a default verify threshold value. Each of the verify threshold values may be expressed as a voltage or as a unitless number that corresponds to a voltage.

In one embodiment of the technology, the default verify threshold value is specified by the manufacturer of the solid-state memory modules. Further, the granularity of the shift values may be specified by the shift value, where the shift value corresponds to a voltage shift of a corresponding default verify threshold value.

In one embodiment of the technology, the verify threshold values (including the default verify threshold values) correspond to voltage values that are used in the process of programming data into memory cells of the solid-state storage modules. More specifically, in one embodiment of the technology, a logical value (e.g., 1 or 0 for memory cells that are SLCs or 00, 10, 11, 01 for memory cells that are MLCs) is programmed into a memory cell in response to a write request. During the programming process, a voltage may be applied to the memory cell, and subsequently the state of the memory cell may be assessed by comparing the voltage held by the memory cell against the corresponding verify threshold value. If the memory cell voltage reaches or exceeds the verify threshold value, the programming may be terminated. However, if the memory cell voltage is found to be below the verify threshold value, another (increased) programming voltage may be applied. The process of applying a programming voltage and comparing the memory cell voltage against the verify threshold value may be repeated until the memory cell voltage reaches or exceeds the verify threshold value.

In one another embodiment of the technology, the verify threshold values (including the default verify threshold values) correspond to voltage values that are used in the process of erasing data from memory cells of the solid-state storage modules. In this scenario the verify thresholds may be referred to as erase verify thresholds.

Figure 5:
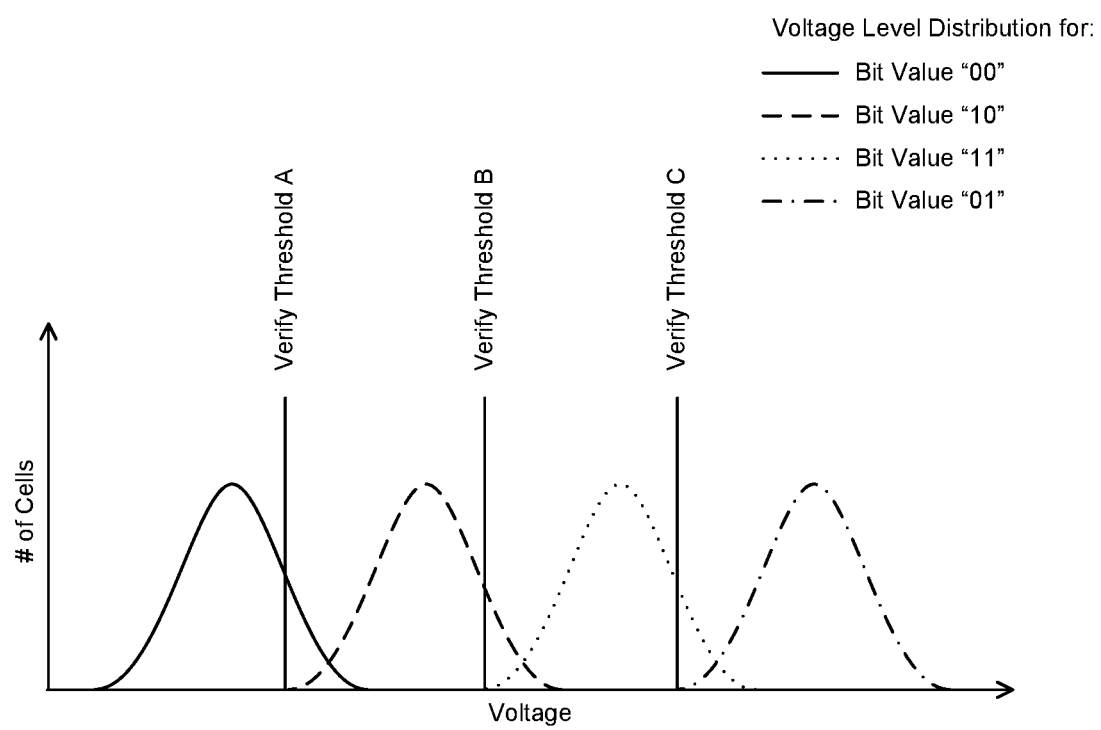
FIG. 5 shows voltage distributions in memory cells of solid state memory in accordance with one or more embodiments of the technology.
Figure 6A:
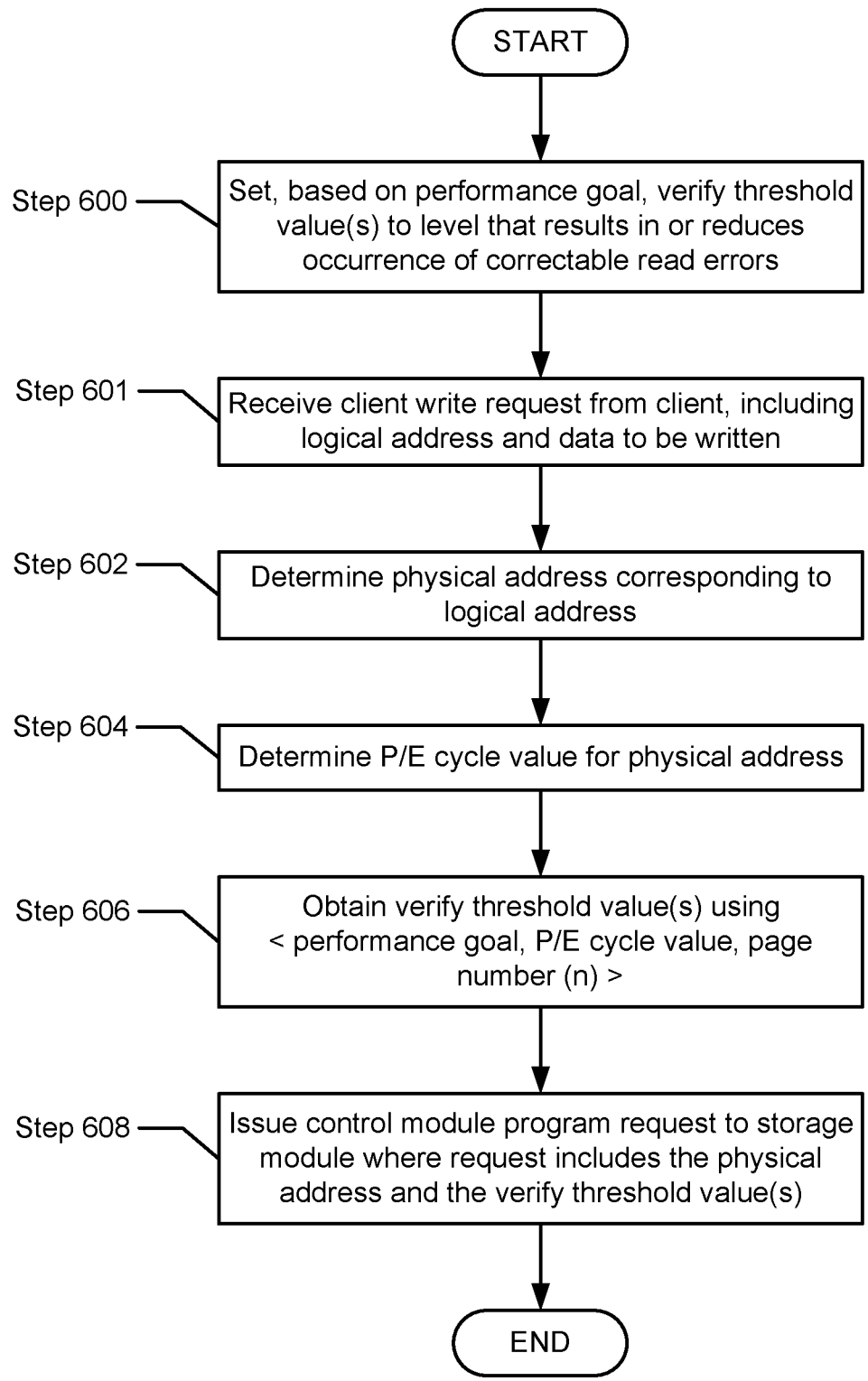
FIGS. 6A and 6B show methods for writing data to a storage module in accordance with one or more embodiments of the technology.
Figure 6B:
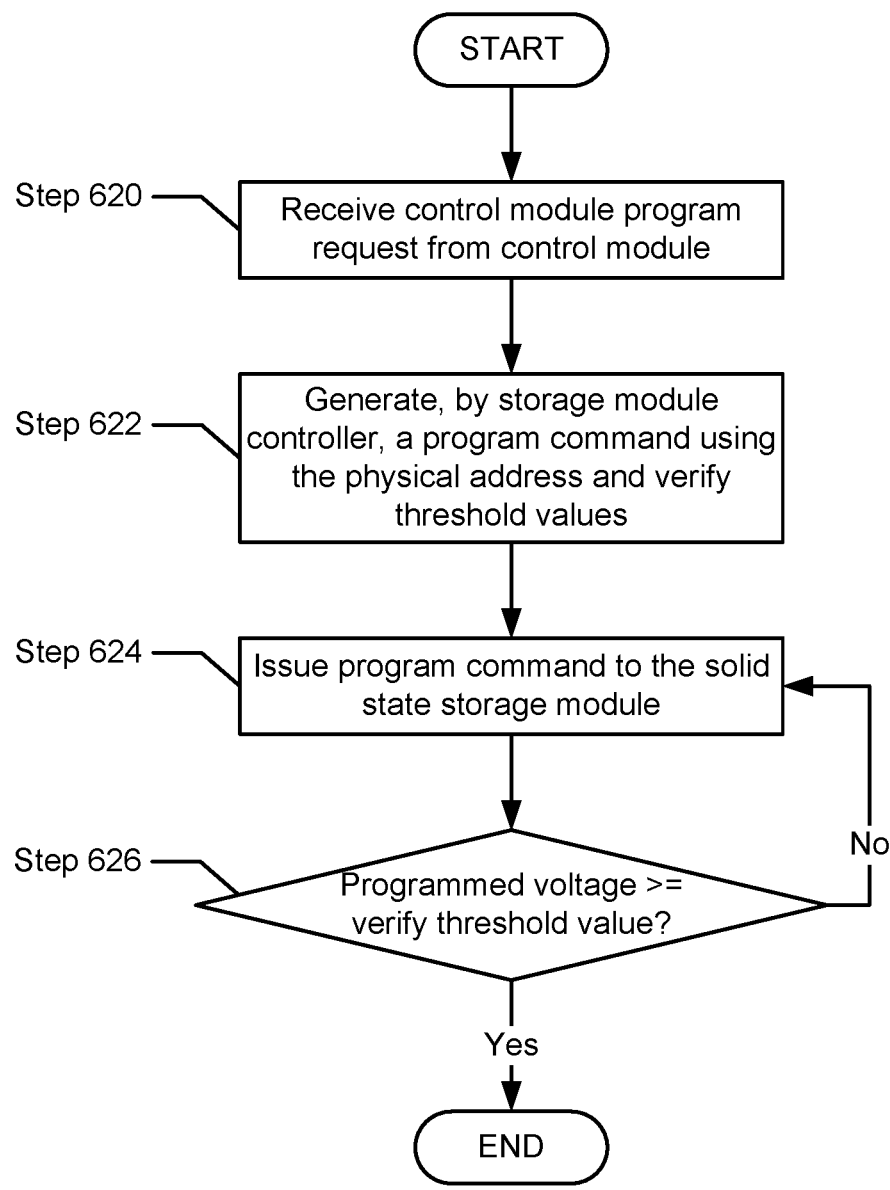

FIG. 5 shows voltage distributions observed in a large number of hypothetical memory cells, programmed as previously described, and as further described in FIGS. 6A and 6B. The graph in FIG. 5 represents voltage levels of MLC memory cells, i.e., cells that may be used to store four voltage levels. Each of these voltage levels, programmed into many memory cells, in FIG. 5, is represented by a distribution. The voltage level distribution for the bit value "00" is represented by the solid curve, the voltage level distribution for the bit value "10" is represented by the dashed curve, the voltage level distribution for the bit value "11" is represented by the dotted curve, and the voltage level distribution for the bit value "01" is represented by the dash-dotted curve. As illustrated in FIG. 5, the programming of a particular voltage into multiple memory cells thus not necessarily result in exact, reproducible memory cell voltages, as indicated by the voltage distributions. Importantly however, in one embodiment of the technology, all voltages in a distribution are above an associated verify threshold to ensure that each programmed cell voltage, when read later, is recognizable as being at a certain programmed cell voltage level. Three verify thresholds (A, B, and C) may be used to distinguish four memory cell voltage levels, as illustrated in FIG. 5.

Those skilled in the art will appreciate that while FIG. 5 shows verify levels from programming memory cells, FIG. 5 does not show erase verify levels. However, memory cells may also include erase verify levels that are used when erasing the memory cells. The erase verify levels specify the upper limit of erase state. For example, referring to FIG. 5, an erase verify level may be located between verify threshold A and verify threshold B.

An example of how the verify thresholds may be implemented for programming memory cells are provided below with reference to FIG. 6B. Those skilled in the art will appreciate that the technology is not limited to the example shown in FIG. 6B.

Those skilled in the art will recognize that a different number of verify thresholds may be used, depending on the type of solid state memory. For example, a single verify threshold may be sufficient to distinguish the two cell voltage levels of a single-level cells (SLCs), three voltage levels may be used to distinguish between the final programmed states in multi-level cells (MLCs), and seven cell voltage thresholds may be used in triple-level cells (TLCs). Further, those skilled in the art will appreciate that additional intermediate voltage thresholds may also be used depending on types of memory components. Further, while in FIG. 5, the voltage distributions are shown as slightly overlapping, voltage distributions may alternatively be fully separated, without departing from the technology.

In one embodiment of the technology, each page in the solid-state memory module may include between 8 kB-16 kB of data. Accordingly, the storage module controller typically programs multiple memory cells in one write cycle. The specific number of memory cells that are programmed in a single write cycle may depend on, for example, the size of a page.

In one embodiment of the technology, the verify threshold value(s) (416) are ascertained by conducting characterizations to determine how the verify threshold values should be set when at least one of, for example, the P/E cycle value, and page number change. More specifically, the verify threshold value(s) (416) may be optimized in a goal-specific manner Various goals and the effect on the verify threshold value(s) are discussed in the uses cases, below.

In one embodiment of the technology, a verify threshold value(s) may be provided for each <performance goal, P/E cycle value, page number> combination. The specific verify threshold value(s) for a given <performance goal, P/E cycle value, page number> may correspond to the default verify threshold value(s) or a non-default verify threshold value(s) (i.e., a verify threshold value other than the default verify threshold value(s)).

In another embodiment of the technology, memory (210 in FIG. 2) only stores a non-default verify threshold value(s) for each <performance goal, P/E cycle value, page number> combination. When using the non-default verify threshold value(s) for programming memory cells, one or more performance goals, as described below in the use cases, may be accomplished. Further, in this scenario, no default verify threshold value(s) may be stored for any <performance goal, P/E cycle value, page number> combination, when using the default verify threshold value(s).

Turning to flowcharts in FIGS. 6A and 6B, while the various steps in the flowchart are presented and described sequentially, one of ordinary skill will appreciate that some or all of the steps may be executed in different orders, may be combined or omitted, and some or all of the steps may be executed in parallel.

FIG. 6A shows a method for processing client write requests by a storage appliance in accordance with one or more embodiments of the technology. Prior to receiving client write requests to process, a characterization of the solid state memory to be targeted by the write operation(s) is performed. As a result of the characterization, and based on a performance goal, in Step 600, one or more verify threshold values are set to one or more levels that result in or reduce the occurrence of correctable read errors (i.e., read errors that are correctable using error correcting code (ECC) mechanisms). Substantively, the characterization process enables the availability of verify threshold values for the combinations of <performance goal, page number, P/E cycle value> that are applicable. Further, prior to receiving client write requests to process, a determination is made regarding the performance goal to be pursued. The performance goal may be selected, for example, by the administrator of the storage appliance specifying that extending the lifetime or enhancing read performance is the performance goal.

In Step 601, a client write request is received by the control module from a client, where the client write request includes a logical address and data to be written.

In Step 602, a physical address (which includes the page number) is determined from the logical address. As discussed above, the memory in the control module includes a mapping of logical addresses to physical addresses (see discussion of FIG. 4, 400, 402). In one embodiment of the technology, the physical address is determined by performing a look-up (or query) using the mapping of logical addresses to physical addresses along with the logical address obtained from the client request in Step 601.

In Step 604, the P/E cycle value for the physical address is determined. The P/E cycle value may be determined by performing a look-up in an in-memory data structure (located in the memory of the control module) using the physical address as the key. The result of Step 604 may be the actual P/E cycle value associated with the physical address (e.g., the P/E cycle value associated with the block in which the physical location corresponding to the physical address is located) or may be a P/E cycle value range (e.g., 5,000-9,999 P/E cycles), where the actual P/E cycle value associated with the physical address is within the P/E cycle value range.

In Step 606, zero or more verify threshold values are obtained from an in-memory data structure (see FIG. 4, 410, 412) using the following key <performance goal, P/E cycle value, page number>. In one embodiment of the technology, the result of Step 606 may be zero verify threshold values when the default verify threshold value(s) is to be used by the storage module controller to write data to the physical address. In one embodiment of the technology, a reserved special value may be used to denote the default verify threshold value(s) as the result of Step 606. In one embodiment of the technology, one or more non-default verify threshold values (see FIG. 4, 412) may be obtained.

Continuing with the discussion in FIG. 6A, in Step 608, a control module program request is generated using the one or more verify threshold value(s) obtained in Step 606 and the physical address. If there are no verify threshold values obtained in Step 606, the control module request may (i) include no verify threshold values or (ii) may include one or more default verify threshold values, where the control module obtains the default verify threshold values in response to no verify threshold values being obtained in Step 606. In one embodiment of the technology, a reserved special value may be translated into the default verify threshold value(s). The format of the control module program request may be any format that is supported by the storage module controller.

In one embodiment of the technology, if there are multiple verify threshold values associated with a given program request (e.g., see FIG. 5, verify threshold value A, verify threshold value B, verify threshold value C), then one or more of the aforementioned verify threshold values may correspond to the default verify threshold value while other threshold values may correspond to non-default threshold values. For example, the verify threshold values may be <default verify threshold value A, non-default verify threshold value B, default verify threshold value C>. Further, in scenarios in which there are multiple verify threshold values, optionally, only the non-default verify threshold values may be determined in Step 606. For example, the result of Step 606 may be <non-default verify threshold value B, non-default verify threshold value C>, which indicates that default verify threshold value A should be used along with non-default verify threshold values for thresholds B and C.

FIG. 6B shows a method for processing control module program requests in accordance with one or more embodiments of the technology. More specifically, FIG. 6B is performed by the storage module controller.

In Step 620, the control module program request is received from the control module. In Step 622, a program command is generated by the storage module controller based on the data, the one or more verify threshold value(s) and the physical address in the control module program request. In one embodiment of the technology, any given program command generated in Step 622 may specify one or more verify threshold values. If the control module does not include any verify threshold values, then the default verify threshold values are used to generate the program command. If the control module program request includes verify threshold values that are in the form of shift values (described above), then generating the program command may include obtaining the default verify threshold values and modifying one or more verify threshold values using the shift value(s). The program command may be in any format that is supported by the solid-state memory modules.

In Step 624, the program command is issued to the solid-state memory module. After the issuance of the program command, a programming voltage may be applied to the memory cell to be programmed. The level of the programming voltage may be selected as further described in Step 626

In Step 626, a determination is made about whether the programmed voltage, obtained from the memory cell in a verification operation, after the application of the programming voltage, is at least equal to the corresponding verify threshold value. If a determination is made that the programmed voltage is at least equal to the corresponding verify threshold value, it may be concluded that the memory cell represents the programmed data, and the execution of the method may terminate. If the programmed voltage is below the verify threshold value, the method may return to Step 624 to repeat the programming. In one embodiment of the invention, the repetition of the programming of a memory cell is performed using a different programming voltage. For example, an initial programming voltage may be used during the first programming cycle. If it is then concluded that the programmed voltage is below the verify threshold value, the programming cycle may be repeated with an increased programming voltage. The repetition of Steps 624 and 626 may result in an incremental increase of the programming voltage until the desired programming result (i.e., a programmed voltage that is at least equal to the corresponding verify threshold value) is detected.

Those skilled in the art will appreciate that the technology is not limited to the specific embodiment described above with respect to FIG. 6B.

Further, those skilled in the art will appreciate that while FIGS. 6A and 6B describe an example of using a verify threshold voltage(s) for purposes of programming memory cells, embodiments of the technology may also be implemented for erasing data from the memory cells. More specifically, in one embodiment of the technology, the control module may receive a request to erase data from a storage module, where the request specifies a logical address or a physical address. The control module may then perform the steps shown in FIG. 6A except that an erase verify threshold(s) will be used instead of a program verify threshold. Further, with respect to FIG. 6B, the storage module controller receives a control module erase request (instead of a control module program request) that includes (or is based on) the erase verify threshold(s) and then performs the steps in FIGS. 622-624 in order to erase data (instead of programming data).

Figure 7:
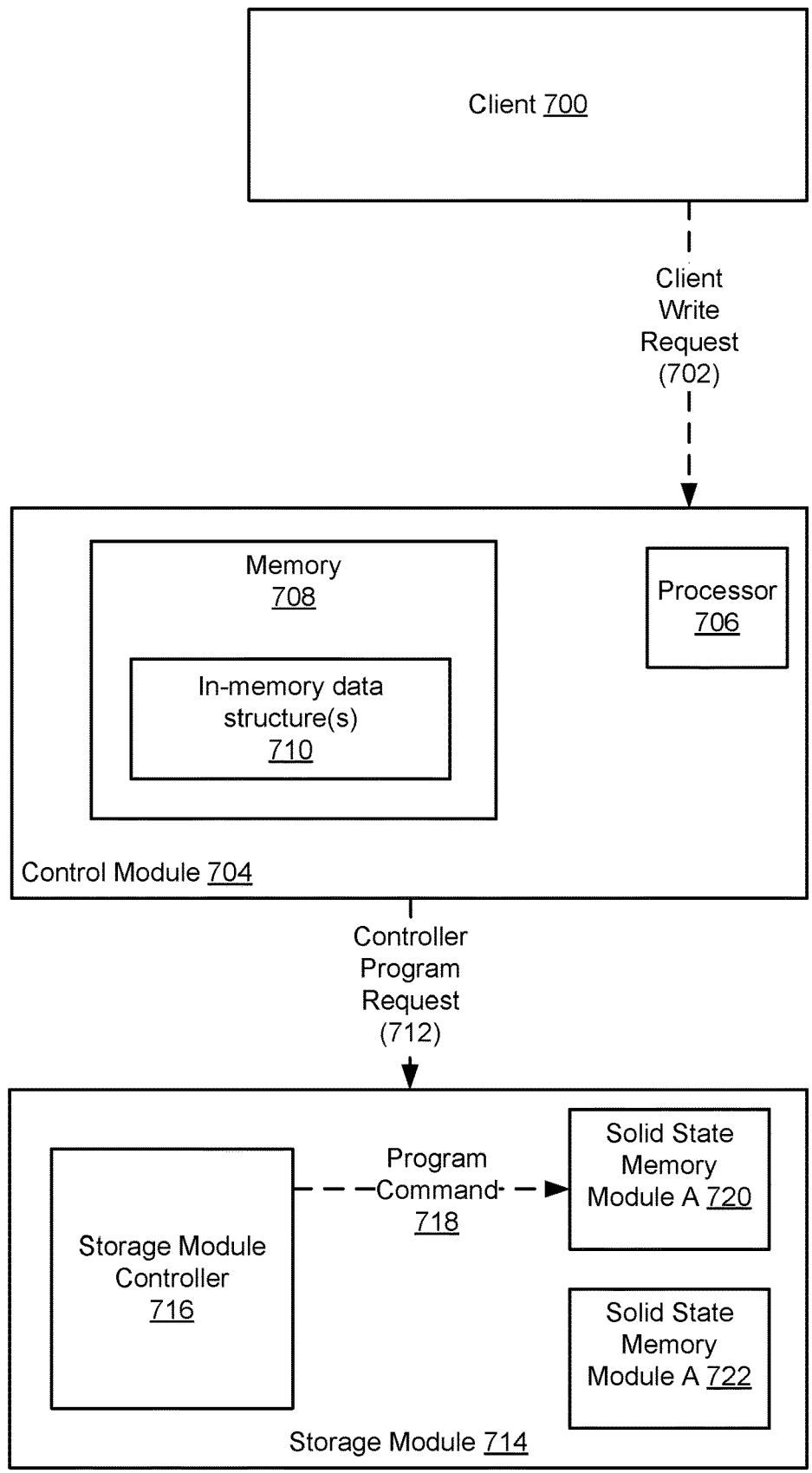
FIG. 7 shows an example in accordance with one or more embodiments of the technology.

FIG. 7 shows an example in accordance with one or more embodiments of the technology. The example is not intended to limit the scope of the technology.

Turning to FIG. 7, consider a scenario in which a client (700) issues a client write request (702), which includes data and a logical address, to a storage appliance that includes a control module (704) and at least one storage module (714). The control module (704) receives the client write request and generates a controller program request (712) using the method described in FIG. 6A using the processor (706) and one or more in-memory data structures (710) stored in the memory (708) on the control module. More specifically, the control module, using one or more in-memory data structures (710), determines the physical address (PA) that corresponds to the logical address. Further, the control module, using one or more in-memory data structures (710) and the physical address, determines the P/E cycle value. The control module then performs a look-up in an in-memory data structure(s) using the following index: <performance goal, P/E cycle value, page number> in order to obtain at least one verify threshold value, where the page number is extracted from the physical address.

In this example assume that the solid-state memory module (720, 722) includes MLCs and that the aforementioned look-up returns verify threshold values in the form of shift values for threshold B and threshold C (see FIG. 5). The control module (704) subsequently generates a controller program request that includes the physical address, a shift value for threshold B and a shift value for threshold C. The controller program request (712) is subsequently issued to the storage module (714) that includes a solid-state memory module (720, 722) that includes the physical location corresponding to the physical address.

The storage module (714) subsequently receives and services the controller program request (712). More specifically, the storage module controller (712) generates and issues a program command (718) to the solid-state memory module that includes the physical location corresponding to the physical address. In this example, the program command is generated using the default verify threshold value A value, a non-default verify threshold B value, and/or a non-default verify threshold C value. The non-default verify threshold value B is determined using the default verify threshold value B and the shift value for verify threshold value B. Further, the non-default verify threshold value C is determined using the default threshold value C and the shift value for verify threshold value C. The storage module controller subsequently performs the programming of the targeted memory cell(s) as described in FIG. 6B using the above verify threshold values. The programming may involve the repeated application of programming voltages until the programmed voltage(s) in the memory cell(s) is/are confirmed to have reached the verify threshold voltage(s).

The use case scenarios described below are intended to provide examples of the method for adapting solid state memory write parameters. Specifically, the following use cases are intended to illustrate how solid state write parameters may be adapted based on particular goals to be achieved. The use case scenarios are based on the exemplary system shown in FIG. 7 and are for illustrative purposes only. The method described by FIGS. 6A and 6B is limited to neither the system shown in FIG. 7, nor to the goals described below.

Example Use Case 1—Optimizing Solid State Memory Lifetime

Solid state memory may age with each programming operation being performed, for example, because the oxide layer that holds the charge of a memory cell deteriorates, thus allowing a stored voltage to gradually bleed out. Aging may occur at an accelerated pace when higher programming voltages are used. Referring to FIG. 5, consider a scenario in which an attempt is made to reduce aging of the solid state memory by applying reduced programming voltages. As a result, the voltage distributions in FIG. 5 are spaced more closely and actually overlap. This tighter spacing of voltages results in the following tradeoff. While the overlap suggests that occasionally a wrong bit value may be read from a memory cell, these erroneous reads may not be problematic if they are sufficiently rare that they are correctable using error correcting code (ECC) mechanisms. However, the reduced programming voltages result in reduced deterioration of the memory cells, thus enabling a prolonged lifetime of the solid state memory.

Accordingly, in the described scenario, assume that the verify thresholds are set such that a tolerable amount of read errors will result from tighter spacing of the reduced programming voltages. The appropriate verify thresholds are determined during an initial characterization of the storage module based on actual read and write operations and/or simulations of the read and write operations. The identified verify thresholds are set such that read errors that are correctable using ECC mechanisms will result when reading data that was previously written using the identified verify thresholds. As the storage module is being used over time, the read error rate may be monitored to detect an increase in read errors (e.g., as the P/E cycle value increases). If such an increase in read errors is detected, the verify thresholds may be increased to slightly higher voltages to cause an increase of the programming voltages, thus, in turn, reducing the read error rate. Further, the verify thresholds may also be increased if a non-recoverable read error is detected (i.e., a read error that could not be corrected using ECC mechanisms and that instead required the use of RAID recovery, for example).

The dynamically adjusted verify thresholds may thus result in reduced aging of the solid state memory, at least initially, and may thus increase overall solid state memory lifetime without sacrificing reliability. To maximize the potential lifetime gain, the setting of the verify thresholds may specifically consider the efficacy of the available ECC mechanism and the availability of other recovery mechanisms such as RAID. In other words, if a particularly powerful ECC mechanism is available (e.g., an ECC algorithm that can detect and correct errors even when they occur at a relatively high error rate), the verify thresholds may be chosen lower, whereas they may be chosen higher if a less potent ECC mechanism is used.

Example Use Case 2—Optimizing Solid State Memory for Performance

The correction of read errors, e.g., using ECC mechanisms may cause a delay, thus reducing read performance. Accordingly, in applications where read-performance is critical, the verify thresholds may be optimized to reduce the occurrence of read errors, including correctable read errors. The verify thresholds may be spaced such that the voltage distributions are sufficiently separated, enabling a voltage value obtained from a memory cell to be unambiguously interpreted. However, the verify thresholds are set not to be unnecessarily far apart to avoid premature aging and eventually failure of the solid state memory. Analogous to the first use case scenario, the read error rate may be monitored to detect read errors once they start occurring (e.g., as the P/E cycle value increases). If read errors are detected, the verify thresholds may be increased to slightly higher voltages to result in an increase of the programming voltages, thus, in turn, reducing the likeliness of a read error. Solid state memory that is programmed accordingly may be operated without relying on time consuming ECC operations, thus increasing read performance, without unnecessarily shortening the lifetime of the solid state memory.

While in the above use cases the verify thresholds are adjust based on feedback (a detection of read errors), the verify thresholds may, in addition or alternatively, be adjusted in a predictive manner, based upon P/E cycle value and/or page number. For example, the verify threshold(s) may be incremented by a small amount after the occurrence of a certain number of P/E cycles. The voltage increment to be applied and/or the number of P/E cycles after which the increment is to be applied may be determined from prior characterizations of solid state memory, and/or modeling and simulations of the aging process occurring as a result of programming and erasing being performed.

One or more embodiments of the technology may be implemented using instructions executed by one or more processors in the storage appliance. Further, such instructions may correspond to computer readable instructions that are stored on one or more non-transitory computer readable mediums.

While the technology has been described with respect to a limited number of embodiments, those skilled in the art, having benefit of this disclosure, will appreciate that other embodiments can be devised which do not depart from the scope of the technology as disclosed herein. Accordingly, the scope of the invention should be limited only by the attached claims.

What is claimed is:

1. A method for adjusting solid state memory write parameters, the method comprising:
   setting a verify threshold value to a level that results in correctable read errors when data, written using the verify threshold value, are read from a storage module, wherein setting the verify threshold value comprises:
   monitoring a correctable read error frequency; and
   adjusting the verify threshold value based on the correctable read error frequency,
   wherein adjusting the verify threshold value comprises:
   making a first determination that a change has been made to the correctable read error frequency; and
   adjusting, based on the first determination, a verify voltage of the verify threshold value;
   receiving, from a client, a client write request, wherein the client write request comprises a logical address and data to be written;
   identifying a physical address corresponding to the logical address, wherein the physical address comprises a page number for a physical page in the storage module;
   obtaining the verify threshold value;
   issuing a control module program request comprising the data to be written and the verify threshold value to the storage module, wherein the storage module comprises the physical page; and
   programming the data into the physical page using the verify threshold value.

2. The method of claim 1, wherein programming the data comprises:
   issuing a first program command, wherein the first program command comprises the data and a programming voltage; and
   performing a verification operation to ensure that the data was programmed at the verify voltage.

3. The method of claim 2, wherein the verification operation comprises:
   when the change indicates that the correctable read error frequency increased:
   making a second determination that a programmed voltage is less than the verify voltage, wherein the programmed voltage is directly correlated with the programming voltage;
   increasing, based on the second determination, the programming voltage to obtain an increased programming voltage; and
   issuing a second program command, wherein the second program command comprises: the data and the increased programming voltage.

4. The method of claim 2, wherein the verification operation comprises:
   when the change indicates that the correctable read error frequency decreased:
   making a second determination that a programmed voltage is greater than the verify voltage, wherein the programmed voltage is directly correlated with the programming voltage;
   decreasing, based on the second determination, the programming voltage to obtain a decreased programming voltage; and
   issuing a second program command, wherein the second program command comprises: the data and the decreased programming voltage.

5. The method of claim 1, wherein adjusting the verify voltage comprises:
   incrementing the verify voltage by an increment voltage amount based on a modeling of an aging process of the storage module, wherein the modeling of the aging process is based on a program erase (PE) cycle value.

6. The method of claim 1, wherein setting the verify threshold value comprises:
    obtaining a default verify threshold; and
    setting the verify threshold value below the default verify threshold.

7. A method for adjusting solid state memory write parameters, the method comprising:
    setting a verify threshold value to a level configured to avoiding read errors when data, written using the verify threshold value, are read from a storage module,
        wherein setting the verify threshold value comprises:
            monitoring a read error frequency; and
            adjusting the verify threshold value based on the read error frequency, wherein
                adjusting the verify threshold value comprises:
                making a first determination that a change has been made to the read error frequency; and
                adjusting, based on the first determination, a verify voltage of the verify threshold value;
    receiving, from a client, a client write request, wherein the client write request comprises a logical address and data to be written;
    determining a physical address corresponding to the logical address, wherein the physical address comprises a page number for a physical page in the storage module;
    obtaining the verify threshold value;
    issuing a control module program request comprising the data to be written and the verify threshold value to the storage module, wherein the storage module comprises the physical page; and
    programming the data into the physical page using the verify threshold value.

8. The method of claim 7, wherein programming the data comprises:
    issuing a first program command, wherein the first program command comprises the data and a programming voltage; and
    performing a verification operation to ensure that the data was programmed at the verify voltage.

9. The method of claim 8, wherein the verification operation comprises:
    when the change indicates that the read error frequency increased:
        making a second determination that a programmed voltage is less than the verify voltage, wherein the programmed voltage is directly correlated with the programming voltage;
        increasing, based on the second determination, the programming voltage to obtain an increased programming voltage; and
        issuing a second program command, wherein the second program command comprises: the data and the increased programming voltage.

10. The method of claim 8, wherein the verification operation comprises:
    when the change indicates that the read error frequency decreased:
        making a second determination that a programmed voltage is greater than the verify voltage, wherein the programmed voltage is directly correlated with the programming voltage;
        decreasing, based on the second determination, the programming voltage to obtain a decreased programming voltage; and
        issuing a second program command, wherein the second program command comprises: the data and the decreased programming voltage.

11. The method of claim 7, wherein adjusting the verify voltage comprises:
    incrementing the verify voltage by an increment voltage amount based on a modeling of an aging process of the storage module, wherein the modeling of the aging process is based on a program erase (PE) cycle value.

12. The method of claim 7, wherein setting the verify threshold value comprises:
    obtaining a default verify threshold; and
    setting the verify threshold value above the default verify threshold.

* * * * *

UNITED STATES PATENT AND TRADEMARK OFFICE
CERTIFICATE OF CORRECTION

PATENT NO. : 10,861,556 B2
APPLICATION NO. : 16/520263
DATED : December 8, 2020
INVENTOR(S) : Haleh Tabrizi, Seungjune Jeon and Andrew Cullen Page 1 of 1

It is certified that error appears in the above-identified patent and that said Letters Patent is hereby corrected as shown below:

In the Claims

Claim 7, Column 15, Line 9, the word "avoiding", should read --avoid--.

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*